United States Patent
Shin et al.

(10) Patent No.: US 9,847,177 B2
(45) Date of Patent: Dec. 19, 2017

(54) COMPOSITE ELECTRONIC COMPONENT AND BOARD HAVING THE SAME

(71) Applicant: SAMSUNG ELECTRO-MECHANICS CO., LTD., Suwon-Si, Gyeonggi-Do (KR)

(72) Inventors: Hong Kyu Shin, Suwon-Si (KR); Hyun Sub Oh, Suwon-Si (KR); Jae Hyuk Choi, Suwon-Si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 135 days.

(21) Appl. No.: 14/636,079

(22) Filed: Mar. 2, 2015

(65) Prior Publication Data

US 2016/0020032 A1    Jan. 21, 2016

(30) Foreign Application Priority Data

Jul. 18, 2014  (KR) .................. 10-2014-0091294
Oct. 22, 2014  (KR) .................. 10-2014-0143391

(51) Int. Cl.

| | | |
|---|---|---|
| *H01G 2/06* | (2006.01) | |
| *H01G 4/232* | (2006.01) | |
| *H01G 9/012* | (2006.01) | |
| *H01G 9/14* | (2006.01) | |
| *H01G 9/15* | (2006.01) | |
| *H01G 4/30* | (2006.01) | |
| *H01G 4/38* | (2006.01) | |

(Continued)

(52) U.S. Cl.
CPC .............. *H01G 4/38* (2013.01); *H01G 2/065* (2013.01); *H01G 4/012* (2013.01); *H01G 4/12* (2013.01); *H01G 4/248* (2013.01); *H01G 4/30* (2013.01); *H01G 9/052* (2013.01); *H05K 3/3442* (2013.01); *H05K 1/181* (2013.01); *H05K 2201/10015* (2013.01); *H05K 2201/2045* (2013.01); *Y02P 70/613* (2015.11)

(58) Field of Classification Search
CPC ........ H01G 2/065; H01G 4/232; H01G 9/012; H01G 9/052; H01G 9/14; H01G 9/15; H01G 9/25; H01G 4/30; H01G 4/40; H01G 4/38; H01G 4/012; H01G 4/12
USPC ............................................. 361/321.1, 301.1
See application file for complete search history.

(56) References Cited

U.S. PATENT DOCUMENTS

| | | | |
|---|---|---|---|
| 7,352,563 B2* | 4/2008 | Pelcak ................... | H01G 9/012 361/329 |
| 2007/0115614 A1* | 5/2007 | Kida ..................... | H01G 2/065 361/540 |

(Continued)

FOREIGN PATENT DOCUMENTS

| | | |
|---|---|---|
| JP | 09-232196 A | 9/1997 |
| JP | 09-326334 A | 12/1997 |
| JP | 2003-234246 A | 8/2003 |

*Primary Examiner* — Eric Thomas
*Assistant Examiner* — Michael P McFadden
(74) *Attorney, Agent, or Firm* — McDermott Will & Emery LLP

(57) ABSTRACT

A composite electronic component includes a composite body having a multilayer ceramic capacitor and a tantalum capacitor coupled to each other, so as to have an excellent acoustic noise reduction effect, a low equivalent series resistance (ESR)/equivalent series inductance (ESL), improved direct current (DC)-bias characteristics, and a low chip thickness.

16 Claims, 13 Drawing Sheets

(51) Int. Cl.
*H01G 4/12* (2006.01)
*H01G 9/052* (2006.01)
*H01G 4/248* (2006.01)
*H01G 4/012* (2006.01)
*H05K 3/34* (2006.01)
*H05K 1/18* (2006.01)

(56) References Cited

U.S. PATENT DOCUMENTS

2009/0067117 A1* 3/2009 Kasuya .................. H01G 4/005
 361/321.2
2010/0033904 A1* 2/2010 Niki .......................... H01G 9/28
 361/523
2013/0271894 A1* 10/2013 Biler ...................... H01G 9/052
 361/528

* cited by examiner

COMPOSITE ELECTRONIC COMPONENT AND BOARD HAVING THE SAME

CROSS-REFERENCE TO RELATED APPLICATIONS

This application claims the priority and benefit of Korean Patent Application Nos. 10-2014-0091294 filed on Jul. 18, 2014 and 10-2014-0143391 filed on Oct. 22, 2014, with the Korean Intellectual Property Office, the disclosures of which are incorporated herein by reference.

BACKGROUND

The present disclosure relates a composite electronic component including a plurality of passive devices.

A multilayer ceramic capacitor, a multilayer chip electronic component, is a chip-type condenser mounted on the printed circuit board of various electronic products, such as image display apparatuses, for example, liquid crystal displays (LCDs), plasma display panels (PDPs), or the like, computers, smartphones, cellular phones, and the like, to serve to charge electricity therein or discharge electricity therefrom.

Such multilayer ceramic capacitors (MLCCs) may be used as the components of various electronic apparatuses due to advantages thereof such as having a relatively small size, high capacitance, as well as ease in the mounting thereof.

The multilayer ceramic capacitor may have a structure in which a plurality of dielectric layers having different polarities are alternately stacked with dielectric layers interposed between the respective internal electrodes.

Since the dielectric layer has piezoelectric and electrostrictive characteristics, a piezoelectric phenomenon may occur between the internal electrodes when a direct current (DC) or alternating current (AC) voltage is applied to a multilayer ceramic capacitor, such that vibrations may be generated.

These vibrations maybe transferred to a printed circuit board on which the multilayer ceramic capacitor is mounted through solders of the multilayer ceramic capacitor, such that the entire printed circuit board may act as a sound radiating surface to generate vibration sound, commonly known as noise.

The vibration sound may correspond to an audio frequency within a range of 20 to 20000 Hz, causing listener discomfort. The vibration sound causing listener discomfort, as described above, may be called acoustic noise.

Research into a product having a form in which a lower cover layer of the multilayer ceramic capacitor is increased in thickness in order to decrease acoustic noise has been conducted.

However, research into a products having better acoustic noise reduction effects is further required.

RELATED ART DOCUMENT (Patent Document 1) Japanese Patent Laid-Open Publication No. 1997-326334

SUMMARY

An aspect of the present disclosure may provide a composite electronic component having an excellent acoustic noise reduction effect.

An aspect of the present disclosure may also provide a composite electronic component having low equivalent series resistance (ESR)/equivalent series inductance (ESL), improved direct current (DC)-bias characteristics, and a reduced chip thickness.

According to an aspect of the present disclosure, a composite electronic component may include: an insulating sheet; conductive connection parts disposed on one or more of upper and lower surfaces of the insulating sheet; a composite body disposed on the upper surface of the insulating sheet and including a multilayer ceramic capacitor and a tantalum capacitor coupled to each other, the multilayer ceramic capacitor including a ceramic body in which a plurality of dielectric layers, and internal electrodes disposed to face each other with respective dielectric layers interposed between the internal electrodes, are stacked, and first and second external electrodes disposed on outer peripheral surfaces of the ceramic body, and the tantalum capacitor including a body part containing tantalum powder particles and having a tantalum wire disposed at one end portion of the body part; a molding part disposed to enclose the composite body; and a positive electrode terminal disposed on a first side surface of the molding part in a length direction of the molding part and a lower surface of the molding part and connected to the tantalum wire and the first external electrode and a negative electrode terminal disposed on a second side surface of the molding part in the length direction and the lower surface of the molding part and connected to the body part of the tantalum capacitor and the second external electrode, wherein the insulating sheet includes via electrodes penetrating through the insulating sheet and electrically connecting the multilayer ceramic capacitor and the tantalum capacitor to the positive electrode terminal and the negative electrode terminal.

According to another aspect of the present disclosure, a board having a composite electronic component may include: a printed circuit board on which electrode pads are disposed, the composite electronic component as described above installed on the printed circuit board, and solders connecting the electrode pads and the composite electronic component to each other.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
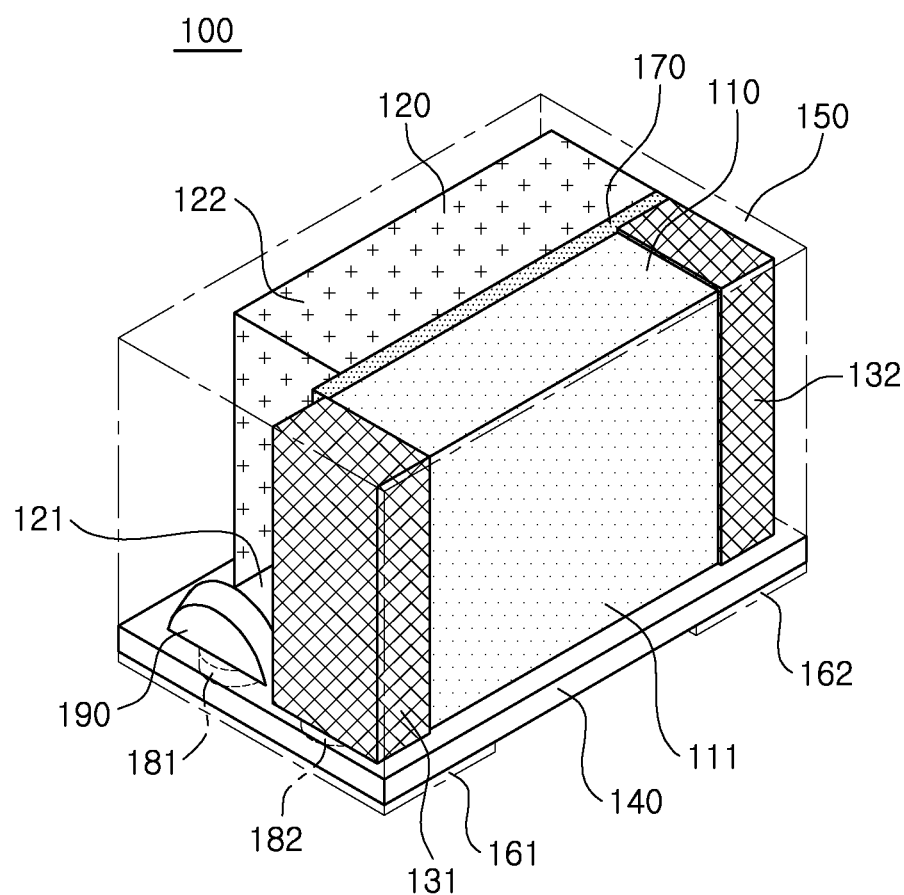
FIG. 1 is s perspective view showing a terminal electrode and a molding part of a composite electronic component according to an exemplary embodiment of the present disclosure.

Exemplary embodiments of the present disclosure will now be described in detail with reference to the accompanying drawings.

The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art.

In the drawings, the shapes and dimensions of elements maybe exaggerated for clarity, and the same reference numerals will be used throughout to designate the same or like elements.

Directions of a hexahedron will be defined in order to clearly describe exemplary embodiments of the present disclosure. L, W and T shown in the accompanying drawings refer to a length direction, a width direction, and a thickness direction, respectively.

Composite Electronic Component

Hereinafter, exemplary embodiments of the present disclosure will be described with reference to the accompanying drawings.

A composite electronic component according to an exemplary embodiment of the present disclosure may include a composite body in which a multilayer ceramic capacitor and a tantalum capacitor are coupled to each other.

According to an exemplary embodiment of the present disclosure, the multilayer ceramic capacitor and the tantalum capacitor may be connected in parallel with each other.

According to an exemplary embodiment of the present disclosure, the composite electronic component may include an insulating sheet on which the multilayer ceramic capacitor and the tantalum capacitor are mounted and a molding part enclosing the multilayer ceramic capacitor and the tantalum capacitor.

According to an exemplary embodiment of the present disclosure, the composite electronic component may include a positive electrode terminal and a negative electrode terminal electrically connected to the multilayer ceramic capacitor and/or the tantalum capacitor.

According to an exemplary embodiment of the present disclosure, the composite electronic component in which the multilayer ceramic capacitor is disposed in an assembled structure of the tantalum capacitor that does not include a lead frame and the tantalum capacitor and the multilayer ceramic capacitor are connected in parallel with each other may implement a high capacitance.

According to an exemplary embodiment of the present disclosure, an insulating layer may be disposed between the tantalum capacitor and the multilayer ceramic capacitor, and an electrical short-circuit may be prevented by the insulating layer.

Hereinafter, a structure of a composite electronic component according to an exemplary embodiment of the present disclosure will be described in more detail.

FIG. 1 is s perspective view showing a terminal electrode and a molding part of a composite electronic component according to an exemplary embodiment of the present disclosure.

Referring to FIG. 1, a composite electronic component 100 according to an exemplary embodiment of the present disclosure may include an insulating sheet 140 and a composite body 130 disposed on an upper surface of the insulating sheet 140 and including a multilayer ceramic capacitor 110 and a tantalum capacitor 120 coupled to each other, the multilayer ceramic capacitor 110 including a ceramic body 111 in which a plurality of dielectric layers and internal electrodes disposed to face each other with respective dielectric layers interposed therebetween are stacked and first and second external electrodes 131 and 132 disposed on outer peripheral surfaces of the ceramic body 111 and the tantalum capacitor 120 including a body part 122 containing tantalum powder particles and having a tantalum wire 121 disposed at one end portion thereof.

The multilayer ceramic capacitor 110 is not particularly limited, but may be a multilayer ceramic capacitor that is generally used.

For example, the multilayer ceramic capacitor 110 may include the ceramic body 111 in which the plurality of dielectric layers and internal electrodes disposed to face each other with respective dielectric layers interposed therebetween are stacked.

In addition, the multilayer ceramic capacitor 110 may include the first and second external electrodes 131 and 132 disposed on the outer peripheral surfaces of the ceramic body 111.

The first and second external electrodes 131 and 132 may be formed of a conductive paste containing a conductive metal.

The conductive metal may be nickel (Ni), copper (Cu), palladium (Pd), or an alloy thereof, but is not limited thereto.

According to an exemplary embodiment of the present disclosure, nickel/tin (Ni/Sn) plating layers may not be disposed on the first and second external electrodes 131 and 132 unlike a general multilayer ceramic capacitor.

Since the composite electronic component includes a molding part 150 disposed to enclose the composite body 130 disposed on the upper surface of the insulating sheet 140 and including the multilayer ceramic capacitor 110 and the tantalum capacitor 120, as described below, the plating layers do not need to be formed on the first and second external electrodes 131 and 132 of the multilayer ceramic capacitor 110.

Therefore, a problem that reliability is decreased due to penetration of a plating solution into the ceramic body 111 of the multilayer ceramic capacitor 110 may be prevented.

According to an exemplary embodiment of the present disclosure, the tantalum capacitor 120 may include the body part 122 and the tantalum wire 121, wherein the tantalum wire 121 may be buried in the body part 122 so that a portion thereof in the length direction is exposed.

The body part 122 of the tantalum capacitor 120 may include a positive electrode body, a dielectric layer, a solid electrolyte layer, a carbon layer, and a negative electrode layer, but is not limited thereto.

The positive electrode body may be formed using tantalum and be formed of a porous sintered material of tantalum powder particles.

The positive electrode body may have the dielectric layer formed on a surface thereof. The dielectric layer may be formed by oxidizing the surface of the positive electrode body. For example, the dielectric layer may be formed of a dielectric material formed of a tantalum oxide ($Ta_2O_5$), which is an oxide of tantalum forming the positive electrode body, and be formed at a predetermined thickness on the surface of the positive electrode body.

The dielectric layer may have the solid electrolyte layer formed on a surface thereof. The solid electrolyte layer may contain a conductive polymer.

In the case in which the solid electrolyte layer is formed of the conductive polymer, the solid electrolyte layer may be formed on the surface of the dielectric layer by a chemical polymerization method or an electrolytic polymerization method. A material of the conductive polymer is not particularly limited as long as it is a polymer having conductivity, but may include, for example, polypyrrole, polythiophene, polyaniline, or the like.

The carbon layer containing carbon may be disposed on the solid electrolyte layer.

The carbon layer may be formed of carbon pastes and be formed by applying the carbon pastes in which conductive carbon material powder particles such as natural graphite, carbon black, or the like, are dispersed in water or an organic solvent in a state in which they are mixed with a binder, a dispersing agent, or the like onto the solid electrolyte layer.

The negative electrode layer containing a conductive metal may be disposed on the carbon layer in order to improve electrical connectivity with the negative electrode terminal, wherein the conductive metal contained in the negative electrode layer may be silver (Ag).

The tantalum capacitor may have, for example, a structure in which an internal lead frame is not present, but is not particularly limited thereto.

According to an exemplary embodiment of the present disclosure, due to a structure of the composite electronic component including the composite body in which the multilayer ceramic capacitor and the tantalum capacitor are coupled to each other, an acoustic nose reduction effect may be excellent, a high capacitance may be implemented, an equivalent series resistance (ESR)/equivalent series inductance (ESL) may low, direct current (DC)-bias characteristics may be improved, and a chip thickness may be low.

The tantalum capacitor may implement a high capacitance, have excellent DC-bias characteristics, and may not generate acoustic noise at the time of being mounted on a board.

On the other hand, the tantalum capacitor has a problem that an ESR is high.

Meanwhile, the multilayer ceramic capacitor may have a low ESR and ESL, but has DC-bias characteristics worse than those of the tantalum capacitor and has a difficulty in implementing a high capacitance.

In addition, the multilayer ceramic capacitor has problems that a chip thickness is thick and acoustic noise is generated at the time of mounting the multilayer ceramic capacitor on the board.

However, since the composite electronic component according to an exemplary embodiment of the present disclosure includes the composite body in which the multilayer ceramic capacitor and the tantalum capacitor are coupled to each other, a high ESR, which is a disadvantage of the tantalum capacitor, may be decreased.

In addition, deterioration of the DC-bias characteristics, which is a disadvantage of the multilayer ceramic capacitor, may be alleviated, and the chip thickness may be decreased.

Further, the multilayer ceramic capacitor that generates the acoustic noise at the time of being mounted on the board and the tantalum capacitor that does not generate the acoustic noise at the time of being mounted on the board may be coupled to each other in a predetermined volume ratio, whereby the acoustic noise reduction effect may be excellent.

Further, in the composite electronic component, since a plating layer is not formed on an external electrode of the multilayer ceramic capacitor, deterioration of reliability due to permeation of a plating solution may not be generated.

According to an exemplary embodiment of the present disclosure, a volume ratio between the tantalum capacitor 120 and the multilayer ceramic capacitor 110 coupled to each other (tantalum capacitor:multilayer ceramic capacitor) may be 2:8 to 9:1.

The volume ratio between the tantalum capacitor 120 and the multilayer ceramic capacitor 110 coupled to each other (tantalum capacitor:multilayer ceramic capacitor) is adjusted to satisfy 2:8 to 9:1, whereby an composite electronic component having a low ESR value and an excellent acoustic noise reduction effect may be implemented.

In more detail, the tantalum capacitor and the multilayer ceramic capacitor may be coupled to each other in a volume ratio of 5:5 to 7:3.

In the case in which the volume ratio of the tantalum capacitor is less than 5, a high capacitance electronic component may not be implemented, and in the case in which the volume ratio of the tantalum capacitor exceeds 7, an ESR and a voltage ripple ($\Delta V$) value may rise.

According to an exemplary embodiment of the present disclosure, in the composite body 130, the multilayer ceramic capacitor 110 may be coupled to a side surface of the tantalum capacitor 120.

A method of coupling the multilayer ceramic capacitor 110 and the tantalum capacitor 120 to each other is not particularly limited. For example, the multilayer ceramic capacitor 110 and the tantalum capacitor 120 may be coupled to each other by applying an adhesive to the side surface of the tantalum capacitor 120.

The multilayer ceramic capacitor 110 and the tantalum capacitor 120 may be connected in parallel with each other.

According to an exemplary embodiment of the present disclosure, as shown in FIG. 1, the multilayer ceramic capacitor 110 and the tantalum capacitors 120 may be disposed on the insulating sheet 140.

The insulating sheet 140 is not particularly limited as long as it has an insulation property, but may be manufactured using an insulating material such as a ceramic based material, or the like.

Although not shown, conductive connection parts may be disposed on any one or more of upper and lower surfaces of the insulating sheet 140.

The conductive connection parts may have any shape as long as they may contain conductive metals to electrically connect the positive and negative electrode terminals outside the molding part and the composite body inside the molding part to each other as described below.

For example, the conductive connection parts may have a shape of metal pads, but are not limited thereto.

In addition, the conductive connection parts may contain copper (Cu) as a conductive metal, but is not necessarily limited thereto.

The conductive connection parts may be connected to the first and second external electrodes 131 and 132 of the multilayer ceramic capacitor 110, to be described below.

In addition, the positive electrode terminal and the first external electrode, and the negative electrode terminal and the second external electrode may be connected to each other, respectively, through the conductive connection parts and via electrodes.

In addition, the body part 122 of the tantalum capacitor 120 and the negative electrode terminal may be connected to each other through the conductive connection part, but are not necessarily limited thereto.

An insulating layer 170 may be disposed between the multilayer ceramic capacitor 110 and the tantalum capacitor 120, and an electrical short-circuit between the respective devices disposed in the composite electronic component may be prevented by the insulating layer 170.

According to an exemplary embodiment of the present disclosure, the molding part 150 may be disposed to enclose the composite body 130.

The molding part 150 may cover the multilayer ceramic capacitor 110, the tantalum capacitors 120, and the upper surface of the insulating sheet 140 having the multilayer ceramic capacitor and the tantalum capacitors disposed thereon.

The molding part 150 may protect the multilayer ceramic capacitor 110 and the tantalum capacitors 120 from an external environment and may be mainly formed of an epoxy or silica based epoxy molding compound (EMC), or the like. However, the present disclosure is not limited thereto.

The composite electronic component according to an exemplary embodiment of the present disclosure may be implemented as one component in which the multilayer ceramic capacitor 110 and the tantalum capacitors 120 are coupled to each other due to the molding part 150.

In addition, the composite electronic component according to an exemplary embodiment of the present disclosure may include a positive electrode terminal 161 disposed on a lower surface of the molding part 150 and connected to the tantalum wire 121 and the first external electrode 131 and a negative electrode terminal 162 disposed on the lower surface of the molding part 150 and connected to the body part 122 of the tantalum capacitor 120 and the second external electrode 132.

The tantalum wire 121 may be inwardly spaced apart from a first side surface of the molding part 150 in the length direction.

In addition, the tantalum wire 121 may be disposed to be downwardly spaced apart from the center of the body part 122 of the tantalum capacitor 120.

In the tantalum capacitor 120, a tantalum capacitor having a structure in which the internal lead frame is not present, the tantalum wire 121 may be inwardly spaced apart from the first side surface of the molding part 150 in the length direction, thereby implementing a capacitance as large as possible as compared with a structure according to the related art.

In addition, the insulating sheet 140 may include via electrodes 181 to 184 penetrating therethrough and electrically connecting the multilayer ceramic capacitor 110 and the tantalum capacitor 120 to the positive electrode terminal 161 and the negative electrode terminal 162.

The via electrodes 181 to 184 may be disposed to be inwardly spaced apart from an interface surface of the insulating sheet 140, but are not necessarily limited thereto.

The tantalum wire 121 may be connected to the via electrode 181 by a conductive paste 190.

The tantalum wire 121 may be connected to the via electrode 181 by the conductive paste 190 to thereby be electrically connected to the positive electrode terminal 161 as described below.

According to an exemplary embodiment of the present disclosure, since the positive electrode terminal 161 is directly connected to the tantalum wire 121 of the tantalum capacitor and the first external electrode 131 of the multilayer ceramic capacitor and the negative electrode terminal 162 is directly connected to the body part 122 of the tantalum capacitor and the second external electrode 132 of the multilayer ceramic capacitor, by the via electrodes 181 to 184 disposed in the insulating sheet 140, unlike a structure of the tantalum capacitor according to the related art, a low ESR/ESL may be implemented.

That is, the positive electrode terminal 161 is directly connected to the tantalum wire 121 of the tantalum capacitor and the first external electrode 131 of the multilayer ceramic capacitor and the negative electrode terminal 162 is directly connected to the body part 122 of the tantalum capacitor and the second external electrode 132 of the multilayer ceramic capacitor, by the via electrodes 181 to 184 disposed to penetrate through the insulating sheet 140, such that a current loop may become short at the time of mounting the composite electronic component on the board, whereby the ESR of the composite electronic component may be further decreased.

Figure 2:
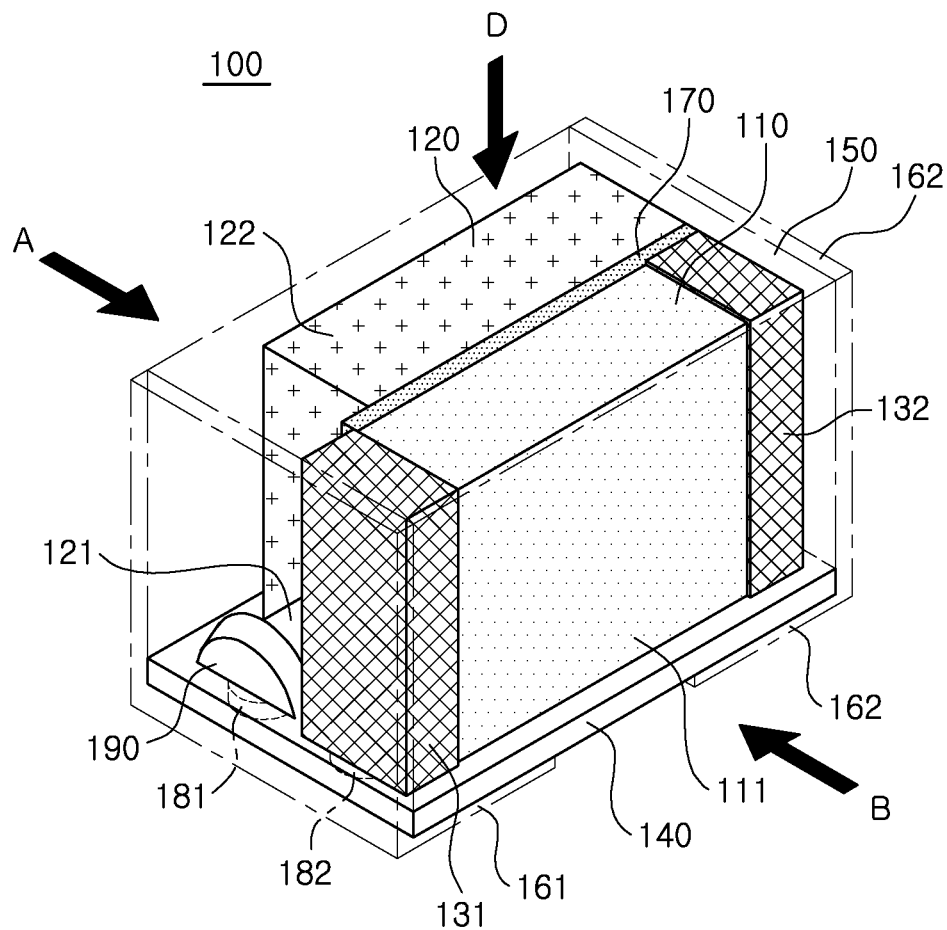
FIG. 2 is s perspective view showing a terminal electrode and a molding part of a composite electronic component according to another exemplary embodiment of the present disclosure.

FIG. 2 is s perspective view showing a terminal electrode and a molding part of a composite electronic component according to another exemplary embodiment of the present disclosure.

Referring to FIG. 2, a composite electronic component according to another exemplary embodiment of the present disclosure has the same features as those of the composite electronic component according to an exemplary embodiment of the present disclosure except that the positive electrode terminal 161 is disposed to be extended to the first side surface of the molding part 150 in the length direction and the negative electrode terminal 162 is disposed to be extended to the second side surface of the molding part 150 in the length direction.

Hereinafter, a structure in which a multilayer ceramic capacitor and a tantalum capacitor included in the composite electronic component according to another exemplary embodiment of the present disclosure are connected to terminal electrodes will be described. However, the present disclosure is not necessarily limited thereto.

Figure 3:
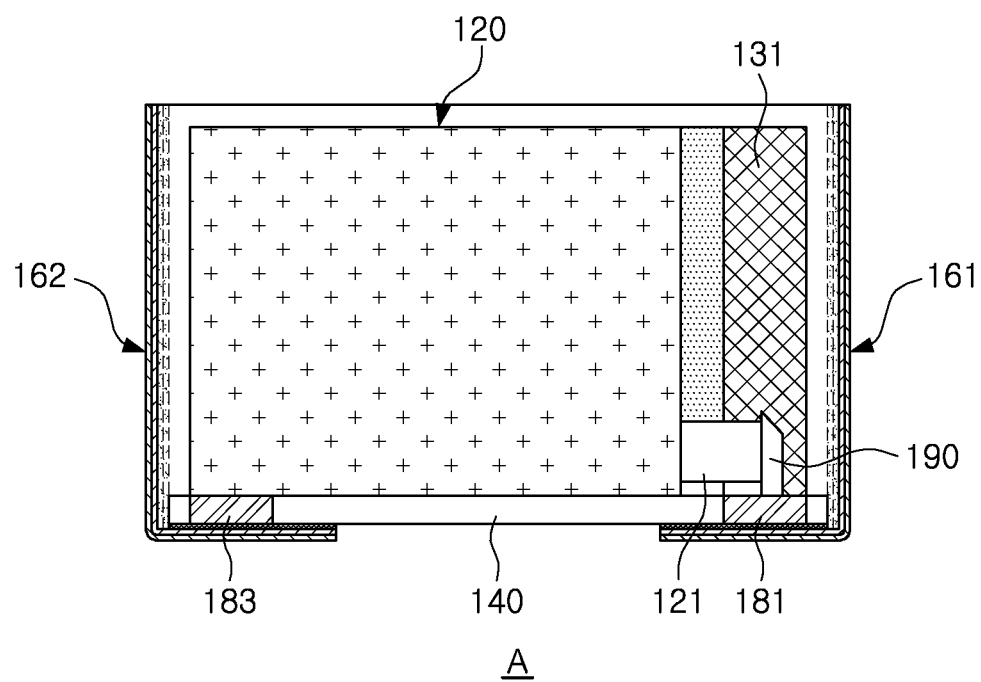
FIG. 3 is a side view when viewed in direction A of FIG. 2.

FIG. 3 is a side view when viewed in direction A of FIG. 2.

Figure 4:
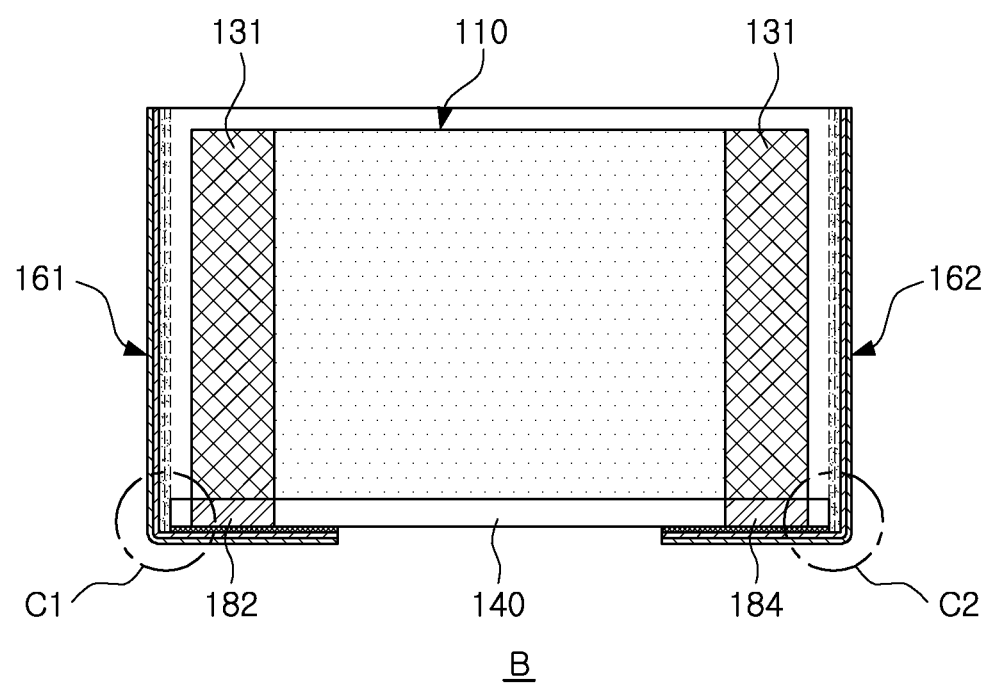
FIG. 4 is a side view when viewed in direction B of FIG. 2.

FIG. 4 is a side view when viewed in direction B of FIG. 2.

Figure 5:
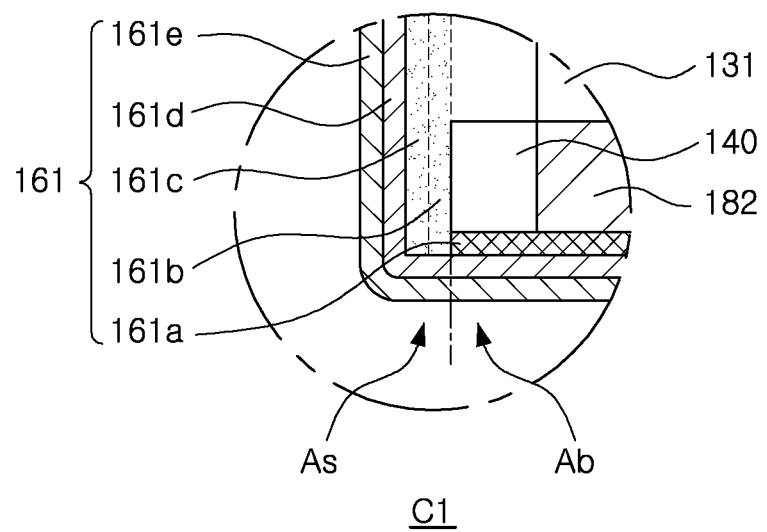
FIG. 5 is an enlarged view of regions C1 and C2 of FIG. 4.
Figure 5:
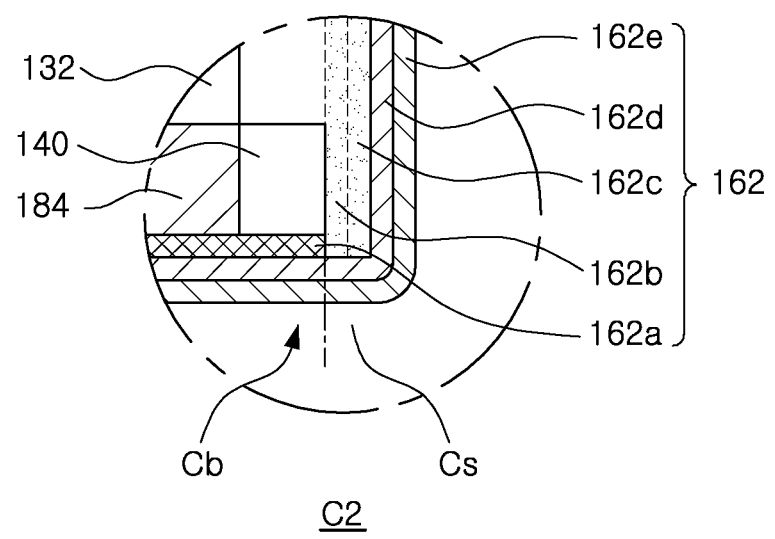

FIG. 5 is an enlarged view of regions C1 and C2 of FIG. 4.

Figure 6:
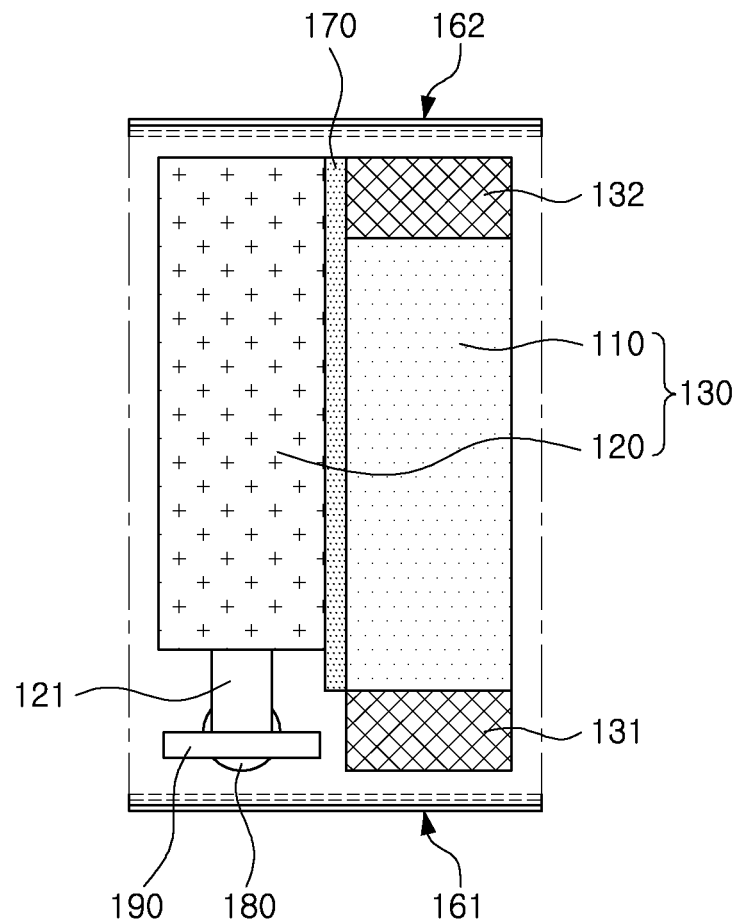
FIG. 6 is a top perspective view when viewed in direction D of FIG. 2.

FIG. 6 is a top perspective view when viewed in direction D of FIG. 2.

Referring to FIGS. 3 and 4, the terminal electrodes may include a positive electrode terminal 161 and a negative electrode terminal 162.

The positive electrode terminal 161 may be disposed on the lower surface of the insulating sheet 140, be extended to the first side surface of the molding part 150 in the length direction, and be connected to the tantalum wire 121 and the first external electrode 131.

In addition, the negative electrode terminal 162 may be disposed on the lower surface of the insulating sheet 140, be extended to the second side surface of the molding part 150 in the length direction, and be connected to the body part 122 of the tantalum capacitor 120 and the first external electrode 132.

The positive electrode terminal 161 and the first external electrode 131 may be connected to each other through one 182 of the via electrodes, and the negative electrode terminal 162 and the second external electrode 132 may be connected to each other through another 184 of the via electrodes.

According to an exemplary embodiment of the present disclosure, the positive electrode terminal 161 may be formed on a portion of the lower surface of the insulating sheet 140 and be extended to the first side surface of the molding part 150 in the length direction, the negative electrode terminal 162 may be formed on a portion of the lower surface of the insulating sheet 140 and be extended to the second side surface of the molding part 150 in the length direction, and the positive electrode terminal 161 and the negative electrode terminal 162 may be formed on the lower surface of the insulating sheet 140 to be spaced apart from each other.

Referring to FIG. 5, the positive electrode terminal 161 may include a positive electrode side surface terminal part As disposed on the side surface of the molding part 150 and a positive electrode lower surface terminal part Ab disposed on the lower surface of the insulating sheet 140, and the negative electrode terminal 162 may include a negative electrode side surface terminal part Cs disposed on the side surface of the molding part 150 and a negative electrode lower surface terminal part Cb disposed on the lower surface of the insulating sheet 140.

According to an exemplary embodiment of the present disclosure, the positive electrode terminal 161 may include a lower surface base layer 161*a*, side surface base layers 161*b* and 161*c* connected to the lower surface base layer 161*a*, and plating layers 161*d* and 161*e* disposed to enclose the lower surface base layer 161*a* and the side surface base layers 161*b* and 161*c*.

In addition, the negative electrode terminal 162 may include a lower surface base layer 162*a*, side surface base layers 162*b* and 162*c* connected to the lower surface base layer 162*a*, and plating layers 162*d* and 162*e* disposed to enclose the lower surface base layer 162*a* and the side surface base layers 162*b* and 162*c*.

Although the lower surface base layers 161*a* and 162*a* have been shown as one layer and the side surface base layers 161*b*, 161*c*, 162*b*, and 162*c* have been shown as two layers in FIG. 5, they are not necessarily limited thereto, but may be disposed in various forms.

The positive electrode terminal 161 and the negative electrode terminal 162 may be formed by processes of dry-depositing (sputtering) and plating at least one of Cr, Ti, Cu, Ni, Pd, and Au, forming a metal layer, and etching the metal layer, but are not limited thereto.

In addition, the positive electrode terminal 161 and the negative electrode terminal 162 may be formed by forming the lower surface terminal parts Ab and Cb and then forming the side surface terminal parts As and Cs to be connected to the lower surface terminal parts Ab and Cb.

The lower surface base layers 161*a* and 162*a* may be formed by etching, but are not necessarily limited thereto.

The lower surface base layers 161*a* and 162*a* may be disposed on the lower surface of the insulating sheet 140, and have patterns formed by applying a metal thin film to the lower surface of the insulating sheet 140 and then performing an etching process in order to form the positive electrode lower surface terminal part Ab and the negative electrode lower surface terminal part Cb.

The lower surface base layers 161*a* and 162*a* are not particularly limited, but may contain, for example, copper (Cu).

In the case in which the lower surface base layers 161*a* and 162*a* are formed using the copper (Cu), they may be excellently connected to the positive electrode side surface terminal part As and the negative electrode side surface terminal part Cs formed by a separate process, and may have excellent electrical conductivity.

Meanwhile, the side surface base layers 161*b*, 161*c*, 162*b*, and 162*c* may be formed by deposition, for example, a sputtering method.

The side surface base layers 161*b*, 161*c*, 162*b*, and 162*c* are not particularly limited, but may be formed of two layers of an inner side and an outer side.

The side surface base layers 161*b* and 162*b* of the inner side among the side surface base layers 161*b*, 161*c*, 162*b*, and 162*c* may contain any one or more of Cr or Ti, may be formed by the sputtering method, and may be connected to the lower surface base layers 161*a* and 162*a*.

The side surface base layers 161*c* and 162*c* of the outer side among the side surface base layers 161*b*, 161*c*, 162*b*, and 162*c* may contain Cu and may be formed by the sputtering method.

Referring to FIG. 6, the tantalum wire 121 of the tantalum capacitor 120 may be disposed to be inwardly spaced apart from the first side surface of the molding part 150 in the length direction and may be electrically connected to the positive electrode terminal 161 through the conductive paste and the via electrode 181, and the positive electrode terminal 161 and the first external electrode 131 may be connected to each other one 182 of the via electrodes.

In addition, the body part 122 of the tantalum capacitor may be electrically connected to the negative electrode terminal 162 by the via electrode 183, and the negative electrode terminal 162 and the second external electrode 132 may be connected to each other by another 184 of the via electrodes.

The positive electrode terminal 161 and the negative electrode terminal 162 may serve as a signal input terminal and a ground terminal, respectively, but are not limited thereto.

Figure 7:
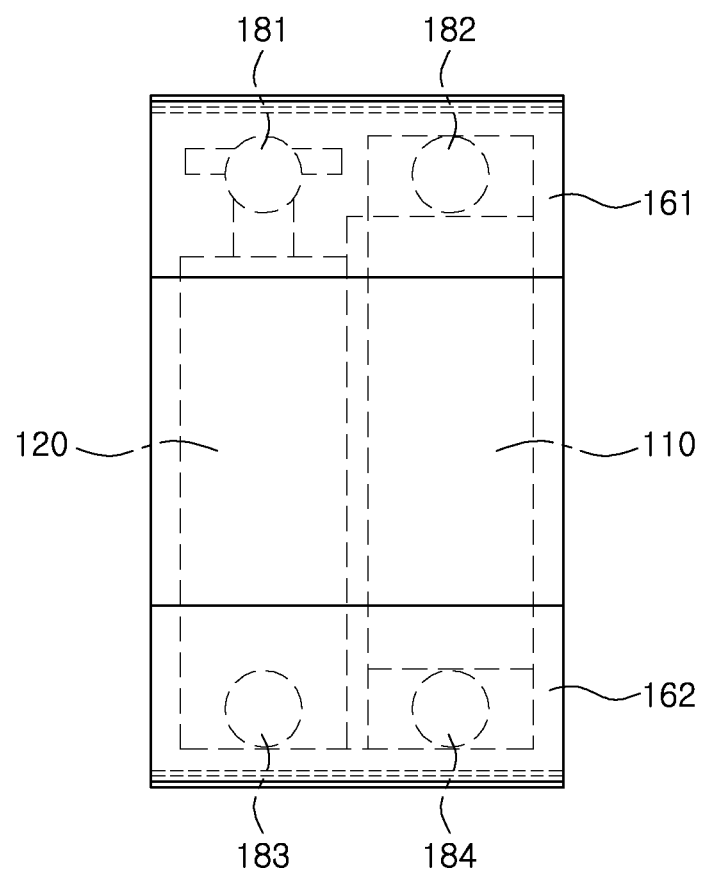
FIG. 7 is a plan view showing an example of a terminal electrode of FIG. 1.

FIG. 7 is a plan view showing an example of a terminal electrode of FIG. 1.

Figure 8:
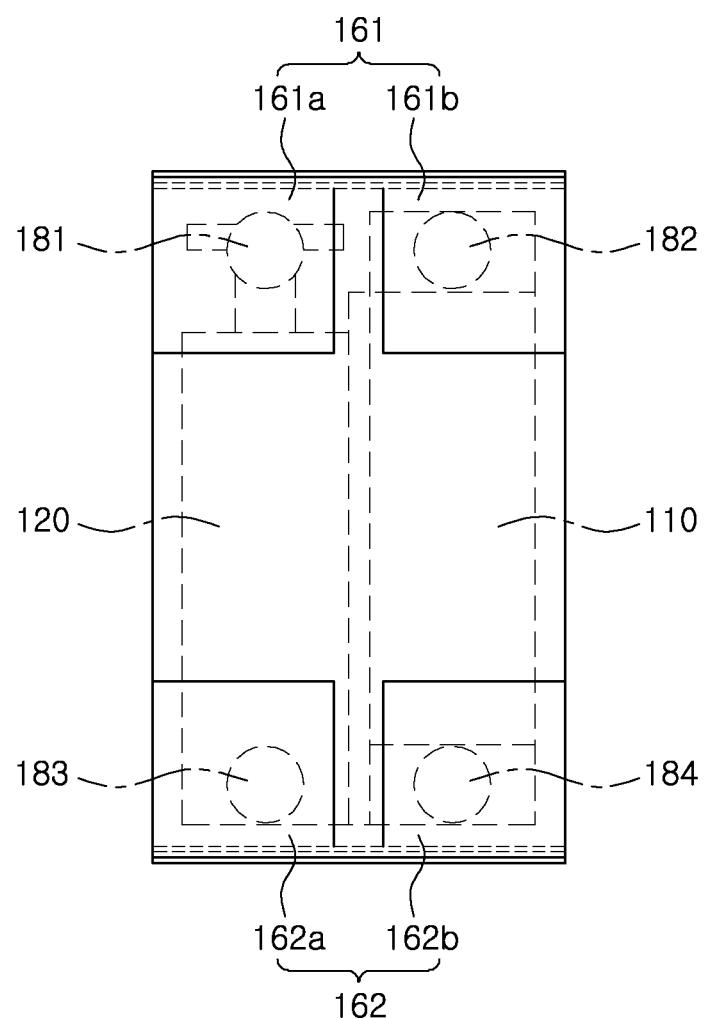
FIG. 8 is a plan view showing another example of a terminal electrode of FIG. 1.

FIG. 8 is a plan view showing another example of a terminal electrode of FIG. 1.

Referring to FIGS. 7 and 8, the positive electrode terminal 161 and the negative electrode terminal 162 disposed on the lower surface of the insulating sheet 140 maybe disposed in any one of 2-terminal to 4-terminal forms.

Referring to FIG. 7, the positive electrode terminal 161 and the negative electrode terminal 162 disposed on the lower surface of the insulating sheet 140 may have the 2-terminal form.

The tantalum wire 121 of the tantalum capacitor 120 may be disposed to be inwardly spaced apart from the first side surface of the molding part 150 in the length direction and may be electrically connected to the positive electrode terminal 161 through the conductive paste and the via electrode 181, and the positive electrode terminal 161 and the first external electrode 131 may be connected to each other one 182 of the via electrodes.

In addition, the body part 122 of the tantalum capacitor may be electrically connected to the negative electrode terminal 162 by the via electrode 183, and the negative electrode terminal 162 and the second external electrode 132 may be connected to each other by another 184 of the via electrodes.

The body part 122 of the tantalum capacitor and the via electrode 183, and the second external electrode 132 of the multilayer ceramic capacitor and the via electrode 184 may be connected to each other through the conductive pastes, respectively.

The conductive pastes may serve to secure electrical connection between the body part 122 of the tantalum capacitor and the via electrode 183 and between the second external electrode 132 of the multilayer ceramic capacitor and the via electrode 184 and adhere (bond) the tantalum capacitor and the multilayer ceramic capacitor to the insulating sheet to be mounted on the insulating sheet.

In addition, the tantalum capacitor and the insulating sheet, and the multilayer ceramic capacitor and the insulating sheet may be firmly closely-adhered to each other by the conductive pastes to decrease an adhesion resistance. Therefore, low ESR characteristics of the multilayer ceramic capacitor may be implemented.

Referring to FIG. 8, the positive electrode terminal 161 and the negative electrode terminal 162 disposed on the lower surface of the insulating sheet 140 may have the 4-terminal form.

The positive electrode terminal 161 may include first and second positive electrode terminals 161a and 161b and the negative electrode terminal 162 may have first and second negative electrode terminals 162a and 162b to have the 4-terminal form.

Although not shown in the accompanying drawings, in the case in which any one of the positive electrode terminal 161 and the negative electrode terminal 162 is separated to two terminals, the positive electrode terminal 161 and the negative electrode terminal 162 may be manufactured to have a three-terminal form.

Figure 9A:
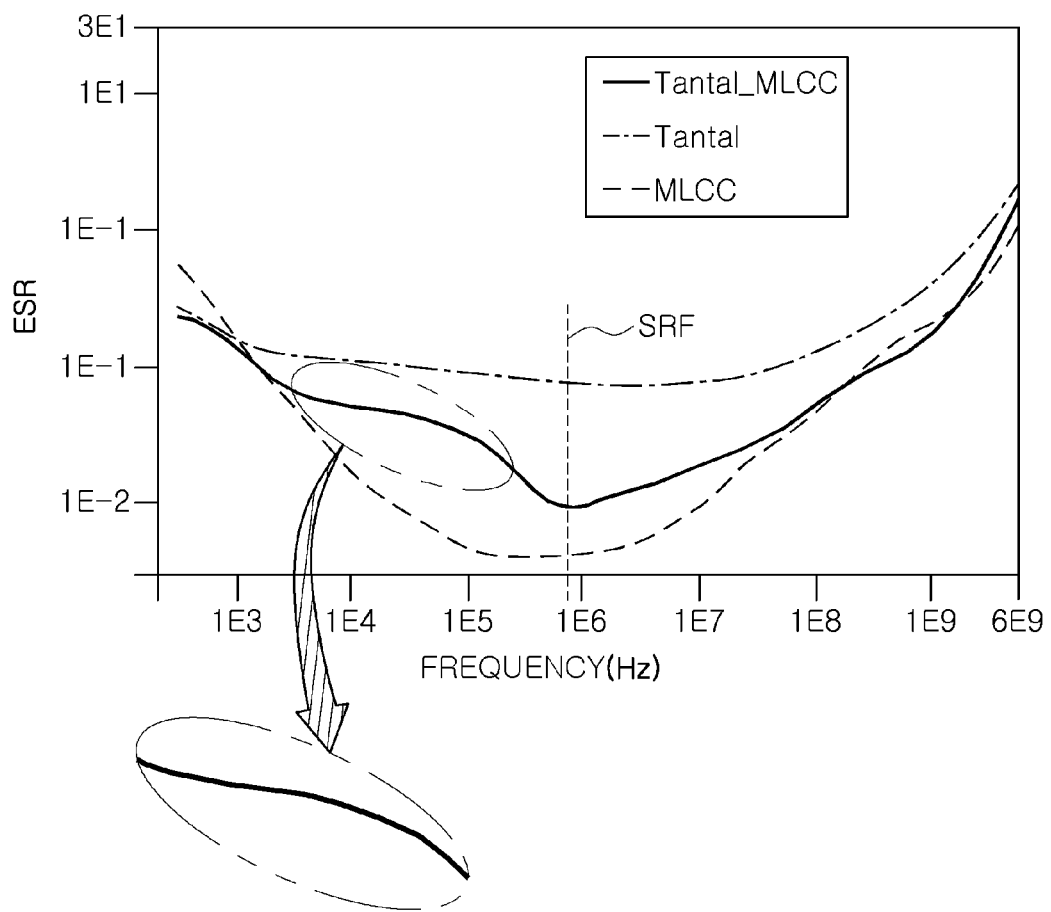
FIGS. 9A and 9B are graphs showing an equivalent series resistance (ESR) and an impedance to a frequency of a composite electronic component according to Inventive Example and a composite electronic component according to Comparative Example.
Figure 9B:
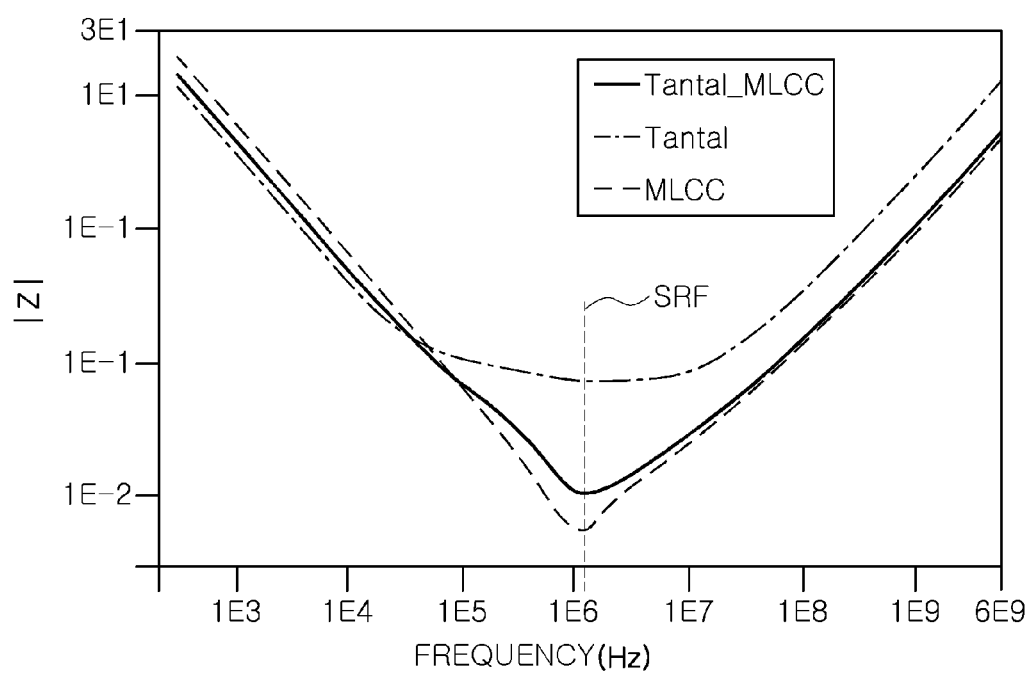

FIGS. 9A and 9B are graphs showing an equivalent series resistance (ESR) and an impedance to a frequency of a composite electronic component according to Inventive Example and a composite electronic component according to Comparative Example.

Referring to FIGS. 9A and 9B, in the graphs showing an ESR and an impedance to a frequency of an input signal in the composite electronic component according to Inventive Example, inflection points of the ESR and the impedance may be generated in at least one of frequency regions before or after a self resonant frequency (SRF).

That is, according to Inventive Example, in the graph showing the impedance to the frequency, an impedance of the tantalum capacitor may appear in a low frequency region, and an impedance of the multilayer ceramic capacitor may appear in a high frequency region.

Therefore, in the graphs showing the ESR and the impedance to the frequency of the input signal, the inflection points of the ESR and the impedance may be generated in at least one of the frequency regions before or after the SRF.

The inflection points of the ESR and the impedance may be generated in at least one of the frequency regions before or after the SRF or be generated in both of the frequency regions before and after the SRF.

Since the inflection points of the ESR and the impedance are generated in at least one of the frequency regions before or after the SRF, the composite electronic component according to an exemplary embodiment of the present disclosure may implement a low ESR.

Figure 10:
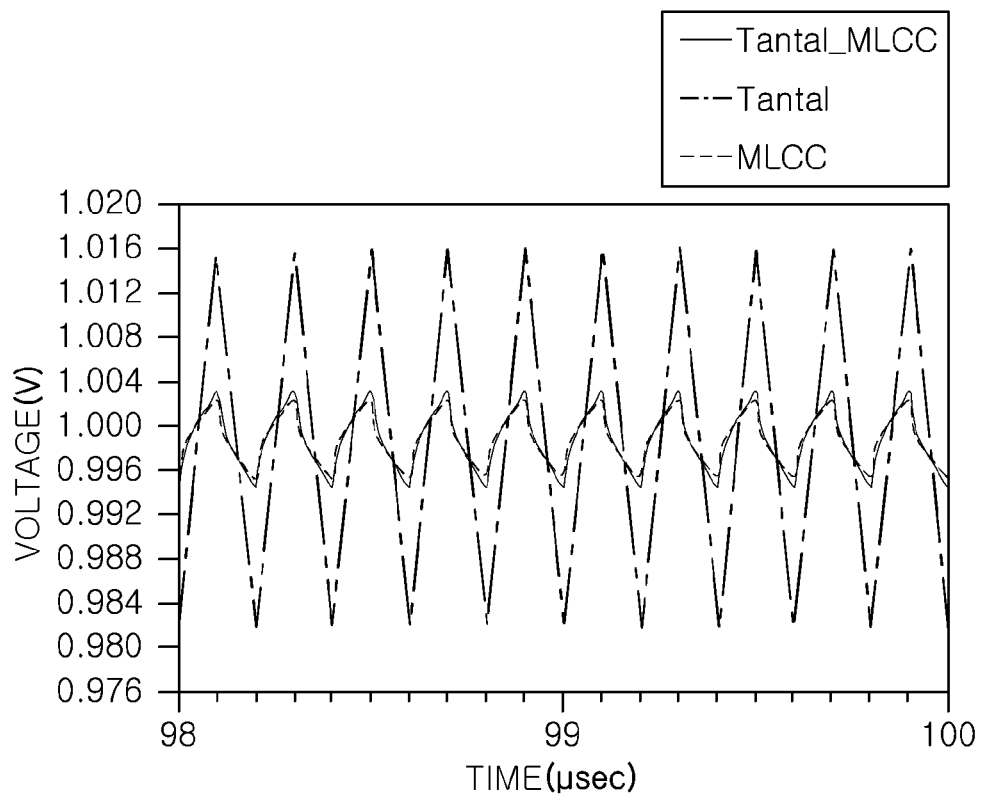
FIG. 10 is a graph showing an output voltage to a time according to Inventive Example and Comparative Example.

FIG. 10 is a graph showing an output voltage to a time according to Inventive Example and Comparative Example.

It may be appreciated from FIG. 10 that a voltage ripple of Inventive Example is significantly decreased as compared with Comparative Example in which only the tantalum capacitor is used and is substantially similar to that of Comparative Example in which only the multilayer ceramic capacitor is used.

That is, it may be appreciated that in the case of Comparative Example in which only the tantalum capacitor is used, a voltage ripple is 34 mV, while in the case of Inventive Example, a voltage ripple is decreased to 9 mV, which is similar to that (7 mV) of Comparative Example in which only multilayer ceramic capacitor is used.

Figure 11:
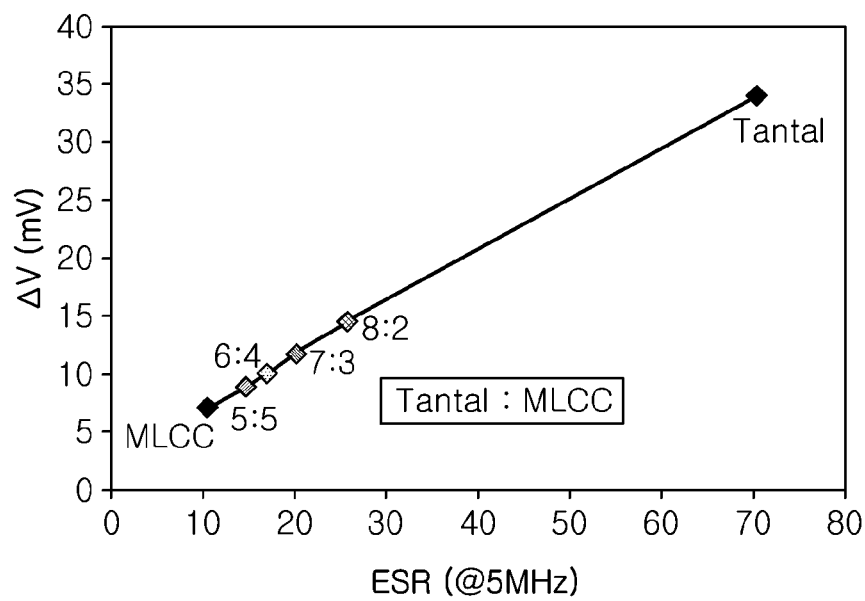
FIG. 11 is a graph showing a voltage ripple (ΔV) as compared with an ESR depending on a volume ratio between a multilayer ceramic capacitor and a tantalum capacitor in the composite electronic component according to an exemplary embodiment of the present disclosure.

FIG. 11 is a graph showing a voltage ripple ($\Delta V$) as compared with an ESR depending on a volume ratio between a multilayer ceramic capacitor and a tantalum capacitor in the composite electronic component according to an exemplary embodiment of the present disclosure.

It may be appreciated from FIG. 11 that in an exemplary embodiment of the present disclosure, in the case in which a volume ratio between the tantalum capacitor and the multilayer ceramic capacitor coupled to each other is 5:5 to 7:3, an electronic component having a low ESR and voltage ripple ($\Delta V$) value and a high capacitance may be implemented.

According to another exemplary embodiment of the present disclosure, a composite electronic component may include an input terminal receiving power converted by a power managing part, a power stabilizing part including a multilayer ceramic capacitor including a ceramic body in which a plurality of dielectric layers and internal electrodes disposed to face each other with respective dielectric layers interposed therebetween are stacked and a tantalum capacitor including a body containing tantalum powder particles and having a tantalum wire formed at one end portion thereof to stabilize the power, and a ground terminal bypassing a ripple of the power, wherein the power stabilizing part decreases the ripple of the received power.

The composite electronic component according to another exemplary embodiment of the present disclosure may mean an electronic component in which a multilayer ceramic capacitor and a tantalum capacitor that may be used instead of capacitors, which are some of a plurality of inductors and capacitors connected to the power managing part to stabilize power, are coupled to each other as one component.

According to another exemplary embodiment of the present disclosure, in the composite electronic component, although the capacitors in the power stabilizing part receiving the power converted by the power managing part and stabilizing the received power are formed as one composite component, the present disclosure is not limited thereto.

The composite electronic component may include the input terminal receiving the power converted by the power managing part, a power stabilizing part including the multilayer ceramic capacitor including the ceramic body in which the plurality of dielectric layers and the internal electrodes disposed to face each other with respective dielectric layers interposed therebetween are stacked and the tantalum capacitor including the body containing the tantalum powder particles and having the tantalum wire formed at one end portion thereof to stabilize the power, and the ground terminal bypassing the ripple of the power.

Figure 12:
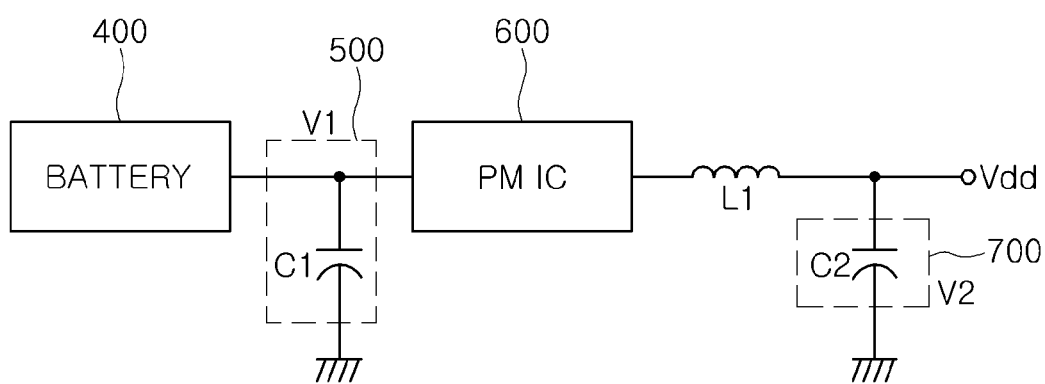
FIG. 12 is a view showing a driving power supplying system supplying driving power to a predetermined terminal requiring the driving power through a battery and a power managing part.

FIG. 12 is a view showing a driving power supplying system supplying driving power to a predetermined terminal requiring the driving power through a battery and a power management integrated chip.

Referring to FIG. 12, the driving power supplying system may include a battery 400, a first power stabilizing part 500, a power managing part 600, and a second power stabilizing part 700.

The battery 400 may supply power to the power managing part 600. Here, the power supplied to the power managing part 600 by the battery 400 will be defined as first power.

The first power stabilizing part 500 may stabilize the first power V1 and supply the stabilized first power to the power managing part. In detail, the first power stabilizing part 500 may include a capacitor C1 formed between a connection terminal between the battery 400 and the power managing part 600 and a ground. The capacitor C1 may decrease a ripple included in the first power.

In addition, the capacitor C1 may be charged with electric charges. In addition, in the case in which the power managing part 600 instantaneously consumes a large amount of current, the capacitor C1 may discharge the electric charges charged therein, thereby suppressing a voltage variation in the power managing part 600.

According to an exemplary embodiment of the present disclosure, the composite electronic component including the composite body 130 in which the multilayer ceramic capacitor 110 and the tantalum capacitor 120 are coupled to each other may be used instead of the capacitor C1.

The power managing part 600 may serve to convert power input to an electronic apparatus into power appropriate for the electronic apparatus and distribute, charge, and control the power. Therefore, the power managing part 600 may generally include a direct current (DC) to DC converter.

In addition, the power managing part 600 may be implemented by a power management integrated circuit (PMIC).

The power managing part 600 may convert the first power V1 into second power V2.

The second power stabilizing part 700 may stabilize the second power V2 and transfer the stabilized second power to an output terminal Vdd. An active device such as an integrated circuit (IC), or the like, receiving the driving power from the power managing part 600 may be connected to the output terminal Vdd.

In detail, the second power stabilizing part 700 may include a capacitor C2 formed between a connection terminal between the power managing part 600 and the output terminal Vdd and a ground.

The second power stabilizing part 700 may decrease a ripple included in the second power V2.

In addition, the second power stabilizing part 700 may stably supply the power to the output terminal Vdd.

According to an exemplary embodiment of the present disclosure, the composite electronic component including the composite body 130 in which the multilayer ceramic capacitor 110 and the tantalum capacitor 120 are coupled to each other may be used instead of the capacitor C2.

The following Table 1 illustrates the results of the determination of capacitance, ESR, and voltage ripple ($\Delta V$) characteristics depending on a ratio of volumes of a tantalum capacitor and a multilayer ceramic capacitor (volume of tantalum capacitor:volume of multilayer ceramic capacitor) in the composite electronic component.

TABLE 1

| Sample | Ratio of Volumes of Tantalum Capacitor and Multilayer Ceramic Capacitor (T:M) | Capacitance ($\mu$F) | ESR (m$\Omega$) | ESL (pH) | Acoustic Noise (dBA) |
| --- | --- | --- | --- | --- | --- |
| 1* | 10:0 | 45.0 | 150 | 471 | 16.6 |
| 2* | 9.5:0.5 | 44.9 | 58 | 415 | 16.6 |
| 3 | 9:1 | 44.7 | 27 | 369 | 16.7 |
| 4 | 8:2 | 44.4 | 22 | 313 | 16.7 |
| 5 | 7:3 | 44.1 | 17 | 281 | 16.8 |
| 6 | 6:4 | 43.8 | 13 | 258 | 16.9 |
| 7 | 5:5 | 43.5 | 11 | 240 | 16.9 |
| 8 | 4:6 | 43.0 | 9.2 | 225 | 17.3 |
| 9 | 3:7 | 42.9 | 8.3 | 213 | 17.5 |
| 10 | 2:8 | 42.6 | 7.3 | 203 | 18.1 |
| 11* | 1:9 | 42.3 | 6.2 | 197 | 26.5 |
| 12* | 0:10 | 42.0 | 5.1 | 207 | 28.2 |

*Comparative Example

IT may be appreciated from Table 1 that in Samples 1 and 2 corresponding to the case in which a volume ratio of the tantalum capacitor exceeds 9 in the composite electronic component, an ESR rises.

In the case in which an ESR value of a capacitor used in a power supply terminal exceeds 30 m$\Omega$, problems such as an increase in a voltage ripple and radiation noise and a decrease in power efficiency may occur.

It may be confirmed that in Samples 11 and 12 corresponding to the case in which the volume ratio of the tantalum capacitor is less than 2, an acoustic noise decreased effect is not large.

In Samples 3 to 10 corresponding to Inventive Examples, which are the case in which a volume ratio between the tantalum capacitor and the multilayer ceramic capacitor coupled to each other is 9:1 to 2:8, a composite electronic component having a lower ESR value and an excellent acoustic noise reduction effect may be implemented.

Board Having Composite Electronic Component

Figure 13:
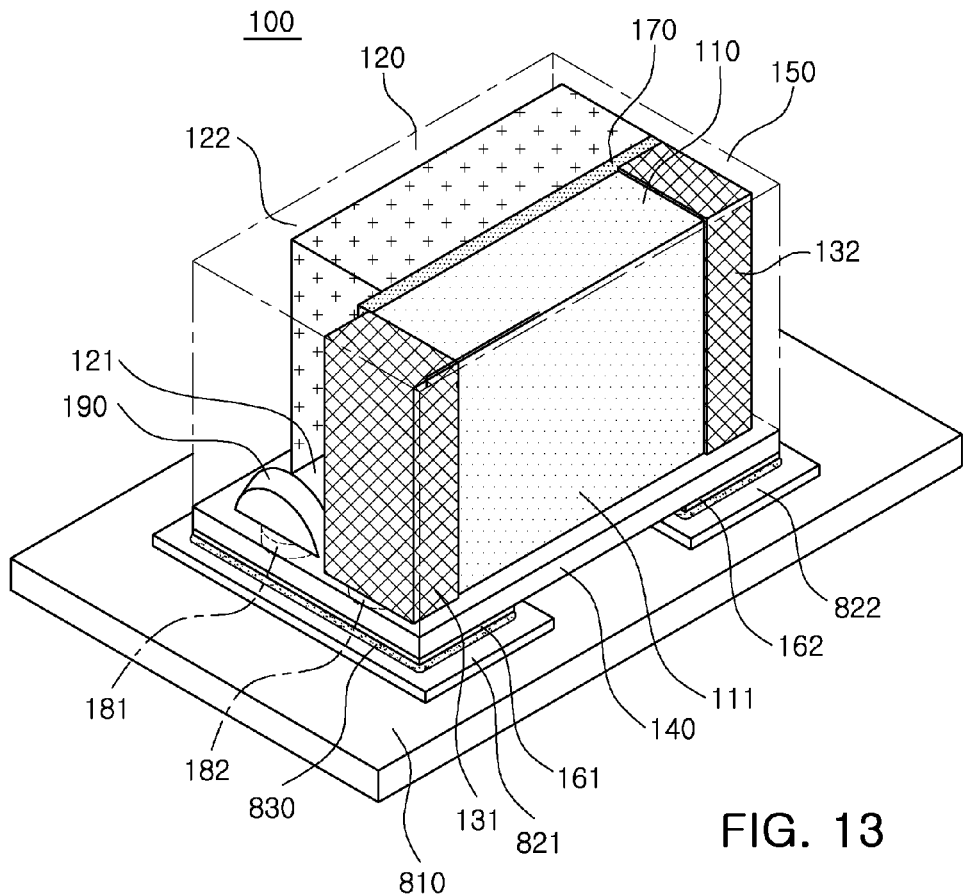
FIG. 13 is a perspective view showing a form in which the composite electronic component of FIG. 1 is mounted on a printed circuit board.

FIG. 13 is a perspective view showing a form in which the composite electronic component of FIG. 1 is mounted on a printed circuit board.

Referring to FIG. 13, aboard 800 having a composite electronic component according to another exemplary embodiment of the present disclosure may include a printed circuit board 810 having electrode pads 821 and 822 disposed thereon, the composite electronic component 100 installed on the printed circuit board 810, and solders 830 connecting the electrode pads 821 and 822 and the composite electronic component 100 to each other.

The board 800 having a composite electronic component according to the present exemplary embodiment may include the printed circuit board 810 having the composite electronic component 100 mounted thereon and two or more electrode pads 821 and 822 formed on an upper surface of the printed circuit board 810.

The electrode pads 821 and 822 may include first and second electrode pads 821 and 822 connected to the positive electrode terminal 161 and the negative electrode terminal 162 of the composite electronic component, respectively.

Here, the positive electrode terminal 161 and the negative electrode terminal 162 of the composite electronic component may be electrically connected to the printed circuit board 810 by the solders 830 in a state in which they are positioned on the first and second electrode pads 821 and 822, respectively, so as to contact the first and second electrode pads 821 and 822, respectively.

Power Stabilizing Unit

Figure 14:
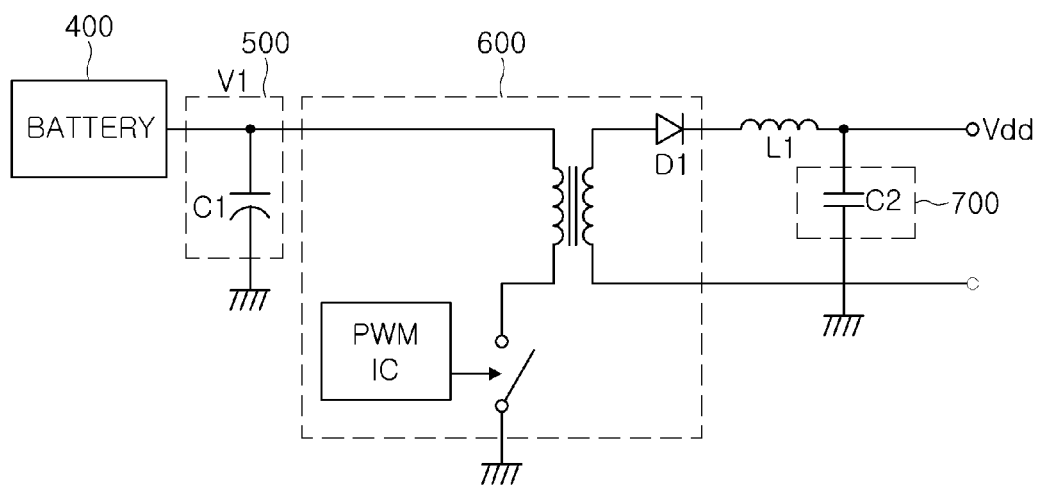
FIG. 14 is a detailed circuit diagram of a power stabilizing unit including the composite electronic component according to an exemplary embodiment of the present disclosure.

FIG. 14 is a detailed circuit diagram of a power stabilizing unit including the composite electronic component according to an exemplary embodiment of the present disclosure.

According to another exemplary embodiment of the present disclosure, a power stabilizing unit may include a battery 400, a first power stabilizing part 500 stabilizing power supplied from the battery 400, a power managing part 600 converting the power provided from the first stabilizing part 500 through a switching operation, and a second power stabilizing part 700 stabilizing the power provided from the power managing part 600, wherein the first power stabilizing part 500 or the second power stabilizing part 700 includes a composite electronic component including a multilayer ceramic capacitor and a tantalum capacitor coupled to each other and decreasing a ripple of the provided power, the multilayer ceramic capacitor including a ceramic body in which a plurality of dielectric layers and internal electrodes disposed to face each other with respective dielectric layers interposed therebetween are stacked and the tantalum capacitor including a body containing tantalum powder particles and having a tantalum wire formed at one end portion thereof.

Referring to FIG. 14, the power stabilizing unit may include the battery 400, the first power stabilizing part 500 stabilizing the power supplied from the battery 400, the power managing part 600 converting the power provided from the first stabilizing part 500 through the switching operation, and the second power stabilizing part 700 stabilizing the power provided from the power managing part 600.

Here, the power managing part 600 may include a transformer having primary and secondary sides insulated from each other, a switch part positioned at the primary side of the transformer and switching the power provided from the first stabilizing part, a pulse width modulation integrated circuit (PWM IC) controlling a switching operation of the switch part, and a rectifying part positioned at the secondary side of the transformer and rectifying the converted power.

That is, the power managing part 600 may convert the power provided from the power stabilizing part 500, for example, a first voltage V1 into a second voltage V2 through the switching operation. Here, the PWM IC among components of the power managing part 600 may control the switching operation of the switch part so as to convert the first voltage V1 into the second voltage V2.

Then, the second voltage V2 may be rectified through the rectifying part, for example, a diode device D1 and be provided to the second power stabilizing part 700.

Meanwhile, the first power stabilizing part 500 or the second power stabilizing part 700 may be the composite electronic component including the composite body having the multilayer ceramic capacitor and the tantalum capacitor coupled to each other, the multilayer ceramic capacitor including the ceramic body in which the plurality of dielectric layers and the internal electrodes disposed to face each other with respective dielectric layers interposed therebetween are stacked and the tantalum capacitor including the body containing the tantalum powder particles and having the tantalum wire formed at one end portion thereof. In addition, the composite electronic component may decrease a ripple of the supplied second voltage V2.

As set forth above, according to exemplary embodiments of the present disclosure, the composite electronic component having an excellent acoustic noise reduction effect may be provided.

In addition, according to exemplary embodiments of the present disclosure, the composite electronic component having a low ESR/ESL, improved DC-bias characteristics, and a low chip thickness may be provided.

While exemplary embodiments have been shown and described above, it will be apparent to those skilled in the art that modifications and variations could be made without departing from the scope of the present invention as defined by the appended claims.

What is claimed is:

1. A composite electronic component comprising:
an insulating sheet;
a composite body disposed on an upper surface of the insulating sheet and including a multilayer ceramic capacitor and a tantalum capacitor coupled to each other, the multilayer ceramic capacitor including a ceramic body in which a plurality of dielectric layers, and internal electrodes disposed to face each other with respective dielectric layers interposed between the internal electrodes, are stacked, and first and second external electrodes disposed on outer peripheral surfaces of the ceramic body, and the tantalum capacitor including a body part containing tantalum powder particles and having a tantalum wire disposed at one end portion of the body part;
a molding part disposed to enclose the composite body; and
a positive electrode terminal disposed on a lower surface of the insulating sheet and connected to the tantalum wire and the first external electrode, and a negative electrode terminal disposed on the lower surface of the insulating sheet and connected to the body part of the tantalum capacitor and the second external electrode,
wherein the insulating sheet includes via electrodes penetrating through the insulating sheet and electrically connecting the multilayer ceramic capacitor and the tantalum capacitor to the positive electrode terminal and the negative electrode terminal, and
the tantalum wire is disposed to be downwardly spaced apart from a center of the body part of the tantalum capacitor,
wherein the positive electrode terminal and the negative electrode terminal each include a lower surface base layer, side surface base layers connected to the lower surface base layer, and plating layers disposed to enclose the lower surface base layer and the side surface base layers, respectively, and
the lower surface base layer includes a first metal and the side surface base layers each include a second metal, the first and second metals being different.

2. The composite electronic component of claim 1, wherein the positive electrode terminal is disposed to be extended to a first side surface of the molding part in a length direction of the molding part, and the negative electrode terminal is disposed to be extended to a second side surface of the molding part in the length direction.

3. The composite electronic component of claim 1, wherein the tantalum wire is inwardly spaced apart from a first side surface of the molding part in a length direction.

4. The composite electronic component of claim 1, further comprising conductive connection parts disposed on one or more of the upper and lower surfaces of the insulating sheet.

5. The composite electronic component of claim 4, wherein the conductive connection parts are connected to the first and second external electrodes, respectively.

6. The composite electronic component of claim 1, wherein the positive electrode terminal and the first external electrode are connected to each other by the via electrode.

7. The composite electronic component of claim 1, wherein the negative electrode terminal and the second external electrode are connected to each other by the via electrode.

8. The composite electronic component of claim 1, wherein the tantalum wire is connected to the via electrode by a conductive paste.

9. The composite electronic component of claim 1, wherein the via electrodes are disposed to be inwardly spaced apart from an interface surface of the insulating sheet.

10. The composite electronic component of claim 1, wherein the body part of the tantalum capacitor is connected to the via electrode by a conductive paste.

11. The composite electronic component of claim 1, wherein the lower surface base layer is formed by etching.

12. The composite electronic component of claim 1, wherein the side surface base layer is formed by deposition.

13. The composite electronic component of claim 1, wherein the positive electrode terminal and the negative electrode terminal disposed on the lower surface of the insulating sheet are disposed in any one of 2-terminal to 4-terminal forms.

14. The composite electronic component of claim 1, wherein the multilayer ceramic capacitor and the tantalum capacitor have an insulating layer disposed on an interface therebetween.

15. The composite electronic component of claim 1, wherein a volume ratio between the tantalum capacitor and the multilayer ceramic capacitor coupled to each other (tantalum capacitor: multilayer ceramic capacitor) is 2:8 to 9:1.

16. A board having a composite electronic component, comprising:
 a printed circuit board on which electrode pads are disposed;
 the composite electronic component of claim 1 installed on the printed circuit board; and
 solders connecting the electrode pads and the composite electronic component to each other.

* * * * *